United States Patent [19]
Bailey et al.

[11] Patent Number: 5,253,613
[45] Date of Patent: Oct. 19, 1993

[54] HIGH POWER AC TRACTION INVERTER COOLING

[75] Inventors: Ronald B. Bailey; Ronald F. Griebel, both of Erie, Pa.

[73] Assignee: General Electric Company, Erie, Pa.

[21] Appl. No.: 876,678

[22] Filed: Apr. 30, 1992

[51] Int. Cl.$^5$ .............................................. H05K 7/20
[52] U.S. Cl. ............................. 123/41.31; 105/49; 310/68 D; 361/697; 363/141; 257/713
[58] Field of Search ................... 62/259.2; 165/23, 42, 165/80.3, 185, 104.34; 363/141; 174/16.3; 357/75, 76, 81, 82; 361/382, 383, 384; 123/41.15, 41.49, 41.65, 41.31; 310/52, 59, 60 A:68 D; 105/49, 59; 257/706, 707, 712, 713, 718, 719

[56] References Cited

U.S. PATENT DOCUMENTS

| | | | |
|---|---|---|---|
| 4,178,630 | 12/1979 | Olsson | 363/141 |
| 4,219,071 | 8/1980 | Careglio | 165/23 |
| 4,520,425 | 5/1985 | Ito et al. | 361/384 |
| 4,628,219 | 12/1986 | Troscinski | 310/680 |
| 4,860,164 | 8/1989 | Kaufman | 361/388 |
| 4,864,385 | 9/1989 | Itahana | 357/82 |
| 4,872,102 | 10/1989 | Getter | 363/141 |
| 4,884,187 | 11/1989 | Budin | 363/141 |
| 5,050,036 | 9/1991 | Oudick | 361/385 |
| 5,052,472 | 10/1991 | Takahashi et al. | 165/1 |

FOREIGN PATENT DOCUMENTS

| | | | |
|---|---|---|---|
| 3244654 | 6/1983 | Fed. Rep. of Germany | 62/259.2 |
| 0165360 | 9/1983 | Japan | 361/384 |

Primary Examiner—Gerald P. Tolin
Attorney, Agent, or Firm—R. Thomas Payne

[57] ABSTRACT

A plurality of high power semiconductor devices are connected in circuit with at least one electric traction motor for controlling electric power to the motor. The semiconductor devices are each thermally connected between a pair of generally hollow heat sinks adapted for passing cooling air therethrough for extracting heat therefrom. An anode terminal of the devices is coupled to one of the heat sinks of a pair and a cathode terminal of the devices is connected to the other heat sink of the pair. Each of the heat sinks are mounted in a cantilever fashion to a common air plenum forming one wall of an electrical circuit area of a vehicle. The distal ends of the heat sinks of a pair are coupled together by an air flow conduit thus forming a continuous air passage through the pair of heat sinks which begins and ends at the surface containing the air supply plenum. One end of one of the pair of heat sinks, preferably the heat sink coupled to the cathode terminal, is connected to an exhaust conduit. Cooling air is then directed into the end of the other heat sink, circulating through the one heat sink and out through the exhaust conduit. In this manner, the cooling air is held in a closed path extending into the electrical circuit area so that contaminants are not deposited on the electrical components.

4 Claims, 3 Drawing Sheets

HIGH POWER AC TRACTION INVERTER COOLING

BACKGROUND OF THE INVENTION

This invention relates to electrically propelled traction vehicles and, more particularly, to cooling systems for high power semiconductors used in such traction vehicles.

Traction vehicles such as, for example, locomotives, employ electric traction motors for driving wheels of the vehicles. In some of these vehicles, the motors are alternating current (AC) motors whose speed and power are controlled by varying the frequency and current of AC electric power supplied to the motors. Commonly, the electric power is supplied at some point in the vehicle system as direct current power and is thereafter inverted to AC power of controlled frequency and amplitude. The electric power may be derived from an on-board alternator driven by an internal combustion engine or may be obtained from a wayside power source such as a third rail or overhead catenary.

Typically, the power is inverted in a solid-state inverter incorporating a plurality of semiconductor devices such as diodes and gate turn-off thyristors (GTO). In a locomotive, large off-highway vehicle or transit application, the traction motors may develop 1000 horsepower per motor thus requiring very high power handling capability by the associated inverter. This, in turn, requires semiconductor switching devices capable of controlling such high power and of dissipating significant heat developed in the semiconductor devices due to internal resistance.

In conventional systems the semiconductor devices are mounted on heat transfer devices such as heat sinks which aid in transferring heat away from the semiconductor devices and thus preventing thermal failure of the devices. For these very high power semiconductors it is desirable to use heat sinks having generally hollow interiors through which cooling air can be forced to remove accumulated heat. Each heat sink is mounted to an air plenum and cooling air is blown through the heat sinks and into the electrical circuit area in which the semiconductors are located. The electrical circuit area may include the various control and timing circuits, including voluminous low power semiconductors, used in controlling switching of the power semiconductors.

In locomotive applications the cooling air is typically derived from blowers drawing air from overhead of the locomotive. The incoming air usually contains contaminants including diesel fumes and dust. A spin filter or inertial filter is used to at least partially clean this cooling air. However, all such contaminants are usually not removed resulting in a buildup of contaminants in the electrical circuit area. Such contaminants impede heat transfer and can also lead to electrical breakdown of insulation gaps in the circuitry. Thus, it is desirable to minimize the buildup of contaminants in such circuitry.

An inverter for large AC motor applications typically includes six high power semiconductor devices, such as GTO's, requiring heat sinks and forced air cooling. Each of these devices are generally press packs which require double side cooling for these high power applications. A common arrangement thus requires twelve heat sinks per inverter. On a six axle locomotive, the inverters alone will include 72 heat sinks requiring cooling air. This number of heat sinks requires a high volume flow of cooling air with and concomitant increase in inertial filter capacity. Thus, it is desirable to provide a method and apparatus for reducing cooling air flow requirements while maintaining adequate cooling of semiconductor devices.

SUMMARY OF THE INVENTION

The above and other desirable features are attained in one form in a power converter system for an electric traction motor vehicle in which a plurality of high power semiconductor devices are connected in circuit with at least one electric traction motor for controlling electric power to the motor. The semiconductor devices are each thermally connected between a pair of generally hollow heat sinks adapted for passing cooling air therethrough for extracting heat therefrom. An anode terminal of the devices is coupled to one of the heat sinks of a pair and a cathode terminal of the devices is connected to the other heat sink of the pair. Each of the heat sinks are mounted in a cantilever fashion to a common air plenum forming one wall of an electrical circuit area of the vehicle. The distal ends of the heat sinks of a pair are coupled together by an air flow conduit thus forming a continuous air passage through the pair of heat sinks which begins and ends at the surface containing the air supply plenum. One end of one of the pair of heat sinks, preferably the heat sink coupled to the cathode terminal, is connected to an exhaust conduit. Cooling air is then directed into the end of the other heat sink, circulating through the one heat sink and out through the exhaust conduit. In this manner, the cooling air is held in a closed path extending into the electrical circuit area so that contaminants are not deposited on the electrical components. The volume of cooling air required is reduced significantly since one-half the cooling air paths are eliminated. The pressure drop through the serially connected heat sinks is higher and thereby increases the pressure requirements to be more compatible with the rotating equipment on the vehicle. The cantilever mounting uses a single wall surface for both mechanical and electrical connection and minimizes criticality of alignment and permitting easy compression of sealing gaskets.

BRIEF DESCRIPTION OF THE DRAWINGS

For a better understanding of the present invention, reference may be had to the following detailed description taken in conjunction with the accompanying drawings in which.

DETAILED DESCRIPTION OF THE DRAWINGS

Figure 1:
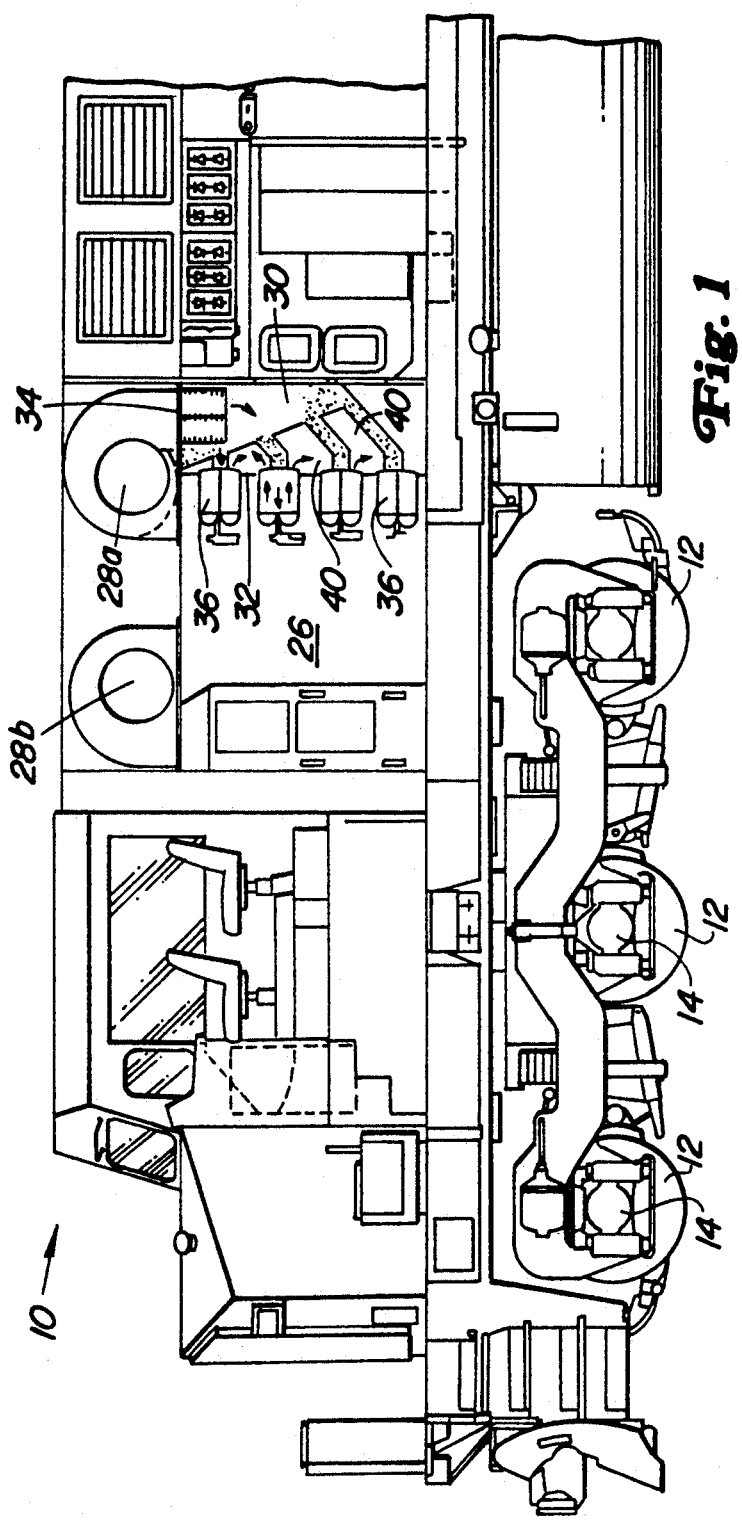
FIG. 1 is a simplified, partial schematic representation of a locomotive employing the teaching of the present invention.

Referring to FIG. 1 There is Shown a simplified, partial cross-sectional view of an electric traction vehicle 10 illustrated as a locomotive, incorporating the present invention. The locomotive 10 includes a plurality of traction motors, not visible in the figure but located behind the drive wheels 12 and coupled in driving relationship to axles 14. The motors are preferably alternating current (AC) electric motors and the locomotive includes a plurality of electrical inverter circuits for controlling electrical power to the motors. Of course this invention can be utilized for cooling press pack semiconductors in any power converter that is force air cooled. It can be efficiently applied to other types of vehicles or typical industrial drives.

Figure 2:
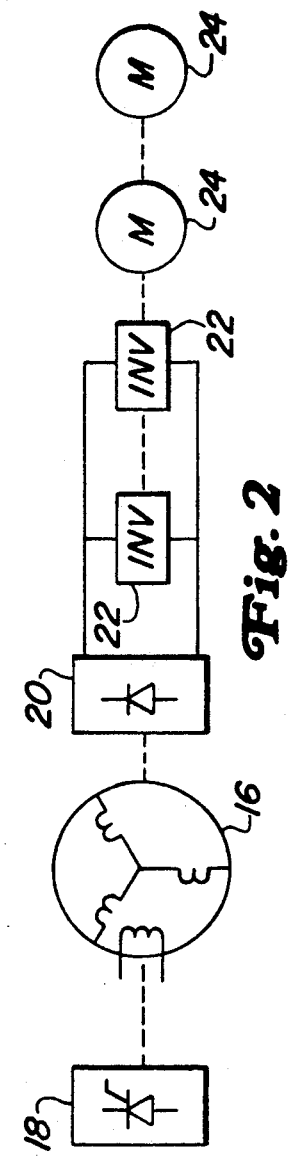
FIG. 2 is a simplified schematic representation of a power circuit for a traction vehicle.

Turning briefly to FIG. 2, a simplified schematic representation of the electrical power system for locomotive 10 includes an alternator 16 driven by an onboard internal combustion engine such as a diesel engine (not shown). Power output of the alternator 16 is regulated in a well known manner by field excitation control indicated by GTO block 18. Electrical power from alternator 16 is rectified, block 20, and coupled to inverters 22. Inverters 22 convert the rectified power to variable frequency, variable amplitude power for application to AC motors 24.

Referring again to FIG. electrical power circuits are at least partially located in equipment compartment 26. The control electronics for the inverters 22 and field control 18 as well as other electronic components are packaged in a conventional manner on circuit boards held in racks in compartment 26. Mounted above compartment 26 are a pair of blowers 28A, 28B which draw air from above the locomotive and blow it onto selected equipment requiring forced air cooling. With regard to the present invention, blower 28A blows air downward into distribution zone or plenum 30. One side of plenum 30 is defined by electrical equipment wall 32, generally vertically oriented, and which separates compartment 26 from plenum 30. The wall 32 is provided with a plurality of predeterminately arranged apertures for passing cooling air between the plenum 30 and compartment 26. The air from blower 28A is passed through a spin or inertial filter 34 as it enters plenum 30.

Within compartment 26, the high power electrical semiconductor devices are mounted to air cooled heat sinks 36. The heat sinks 36 are attached in cantilever fashion to equipment wall 32. The heat sinks 36 are of the type that are generally hollow, having a plurality of fins extending between opposite side walls defining longitudinally extending air passages from end-to-end. The heat sinks 36 are arranged in pairs in the illustrative embodiment with distal ends of each pair being coupled together by an air conduit 38. At wall 32, the heat sink ends are sealingly mounted to preselected ones of the apertures extending through wall 32. On the plenum side of wall 32, selected ones of the apertures are connected to exhaust conduits 40 which extend outside the plenum 30. The arrangement is such that cooling air from plenum 30 flows into one end of one of a pair of heat sinks and exhausts through another end of the pair of heat sinks.

Figure 3:
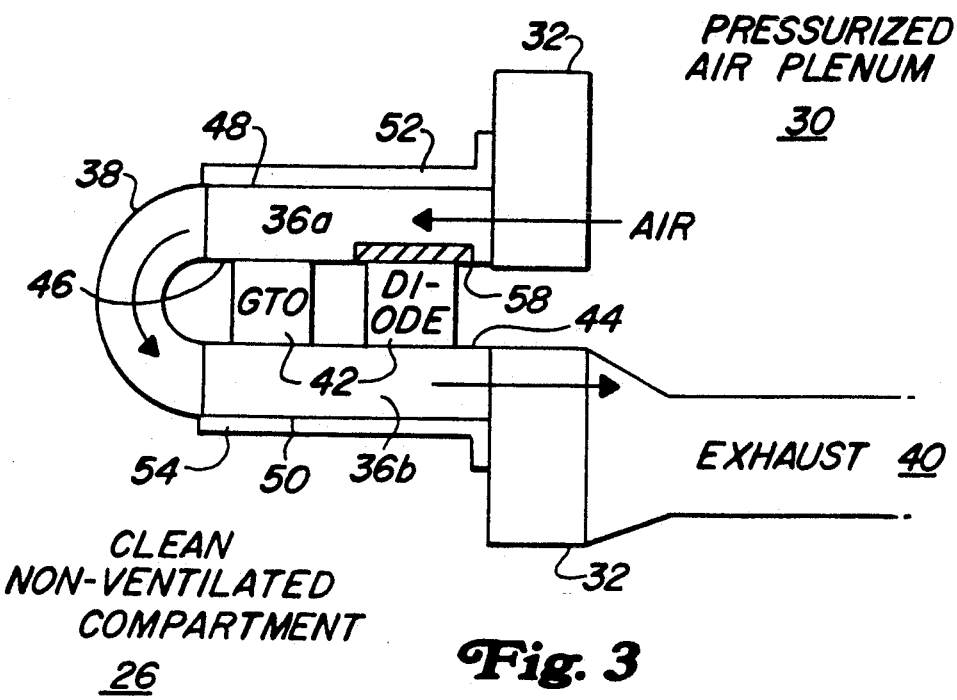
FIG. 3 is an enlarged, simplified representation of a system embodying the present invention.

FIG. 3 is an enlarged schematic representation of one of the pairs of heat sinks 36 in which a pair of semiconductor devices 42, illustrated as a diode and a GTO, are compressively mounted between opposing faces 44, 46 of the heat sinks. The devices 42 are typically press-pack packaged and clamping apparatus (not shown) is provided to compress the heat sinks 36 toward each other with a predetermined compressive force. Various forms of clamping for this type of device mounting is well known in the art. In the illustrative cantilever mounting, the outer surfaces 48, 50 of the pair of heat sinks may be attached to or comprise structural supports 52, 54 which may be bolted to wall 32 for sealingly compressing the ends of the heat sinks 36 over apertures in wall 32. The conduit 38 may be bolted or otherwise fastened to the ends of the heat sinks 36 within compartment 26. The area indicated at 58 represents a cutaway or machined area of heat sink 36A for accommodating variation in the height of a press pack for different semiconductor devices. The diode press pack is generally shorter than that of the GTO and usually only requires coding on one terminal surface. The area 58 allows room for a clamp (not shown) to compress the diode 42 against heat sink 36B and isolate the contact with sink 36A.

As is shown, air from plenum 30 is forced through a first heat sink 36A, passes through conduit 38 and then through heat sink 36B, exiting through exhaust conduit 40. All of the electrical connections for the power system, including the power semiconductors devices 42, may be made within the compartment 26 and attached to the wall 32. However, the contaminated cooling air is contained within the heat sinks 36. By using the serially connected heat sinks 36, the air can be applied first to the anode terminal of the GTO devices, which terminal transfers more heat and requires more cooling, and thereafter applied to the GTO cathode terminal and one terminal of the diode. The single-ended air entry eases assembly and maintainability of a clean air compartment 26. Further, the high pressure and low flow requirement for cooling of the serially connected heat sinks is more compatible with the cooling requirements of the motors and alternators of the system. The heat sinks 36 may be electrically isolated by various known means. Typically, the conduit 38 would be formed of a nonconductive material for electrical isolation.

Figure 4:
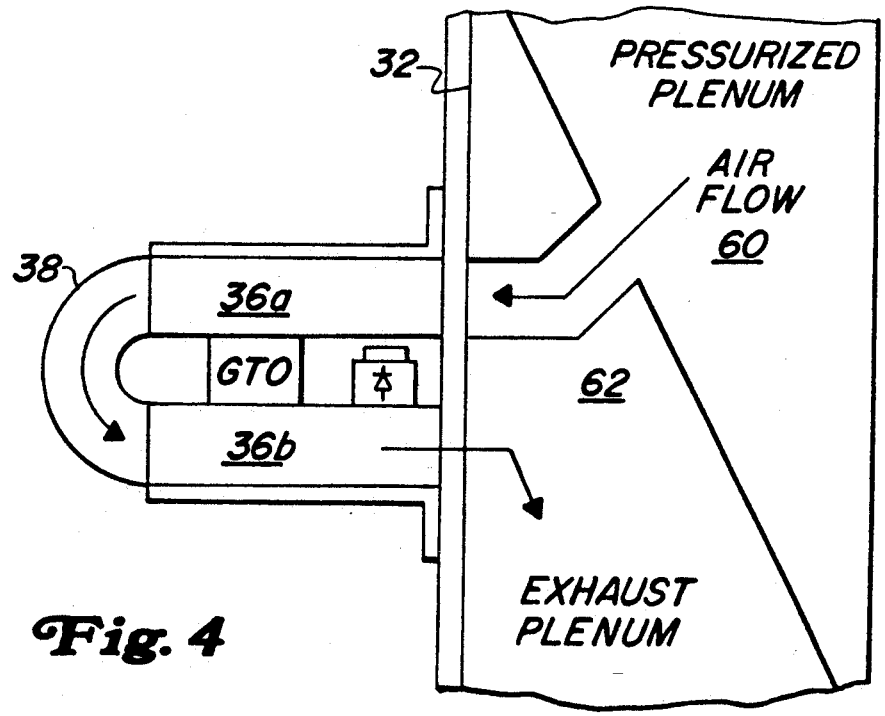
FIG. 4 is an enlarged partial section representation of the cantilever mounting of heat sinks to a vertical wall shown in FIG. 1.
Figure 5:
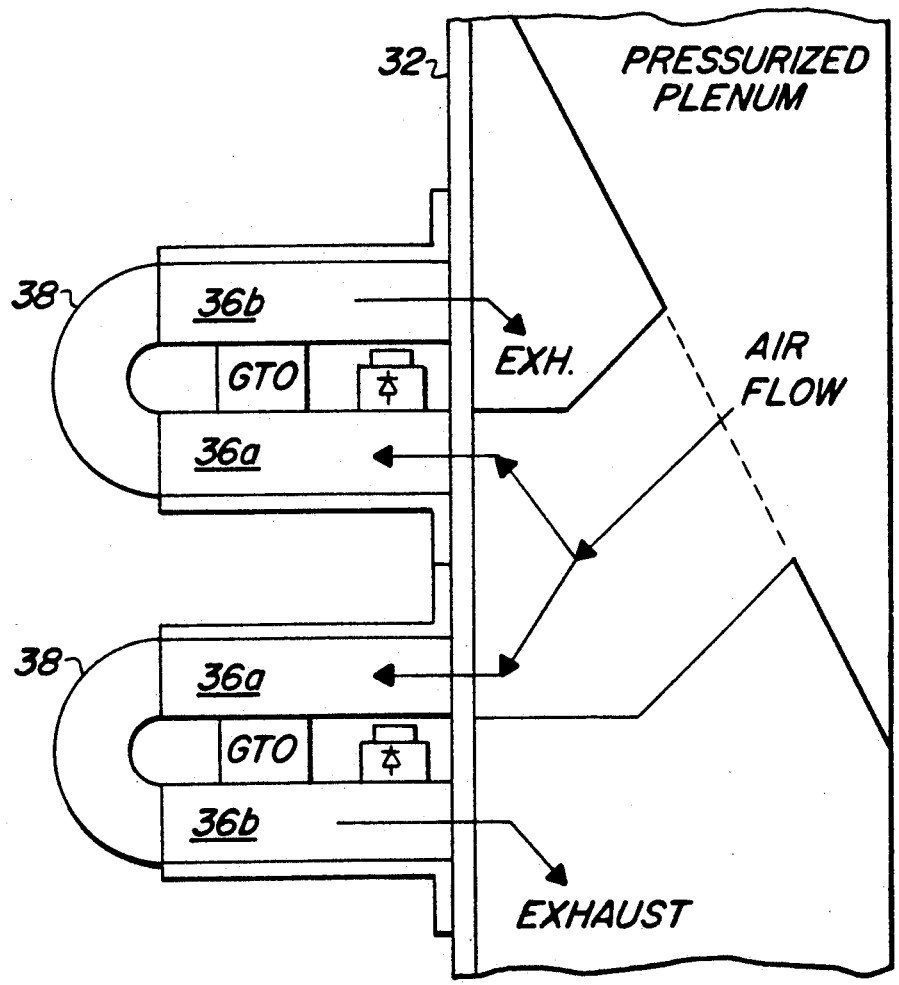
FIG. 5 is an enlarged partial section representation of the system including plural cantilever mountings.

An alternate arrangement is shown in FIG. 4 wherein an inlet end of the heat sink 36A is coupled to a pressurized air plenum 60 and an exhaust end of heat sink 36B is coupled to an exhaust plenum 62. It will be apparent that multiple heat sinks could be connected in parallel arrangement between the plenum 60 and plenum 62.

While the invention has been described in a preferred form, it is intended that the invention be interpreted within the full spirit and scope of the appended claims.

What is claimed is:

1. An alternating current (AC) electric powered locomotive comprising:
   a plurality of AC electric motors each coupled in driving relationship to a respective pair of a plurality of pairs of wheels on the locomotive;
   a direct current (DC) electric power source;
   an inverter mounted in the locomotive, said inverter including a plurality of semiconductor devices arranged for receiving DC electric power from said DC electric power source and for inverting said DC electric power to AC electric power for application to said AC electric motors;
   an electrical device compartment defined by at least one wall vertically oriented in said locomotive, an air exhaust and an air supply plenum being formed on an opposite side of said wall from said electrical device compartment, said wall including a plurality of apertures therethrough from each of said air exhaust and said air supply plenums;
   a plurality of hollow air cooled heat sinks each having one end attached to said wall in a cantilever fashion, said heat sinks being arranged in pairs such that a first end of one of a pair is coupled to said wall overlaying an aperture therethrough to said air supply plenum and a first end of another of the pair is coupled to said wall overlaying an aperture therethrough to said air exhaust plenum;

clamping means operatively associated with each of said pair of heat sinks and adapted to compress each heat sink of each pair toward the other heat sink of the pair when selected ones of said semiconductor devices are positioned between the heat sinks of each pair of heat sinks, the clamping means clamping said heat sinks into thermal contact with opposing power terminals of said semiconductor devices;

electrically insulative conduit means coupled to second ends of each of said pair of heat sinks for forming a continuous air passage between said heat sinks; and blower means mounted in the locomotive and coupled to said air supply plenum for forcing air into said supply plenum and into each of said one of said pairs of heat sinks through said wall, in parallel, said air being exhaust from said first end of said another of said pairs of heat sinks through said wall into said exhaust air plenum in parallel.

2. The locomotive of claim 1 wherein said DC electric power source comprises an alternator mounted on the locomotive and a diesel engine coupled in driving relationship with said alternator.

3. A method for improving cooling air performance in a diesel-electric locomotive having a diesel engine coupled in driving relationship with an alternator for supplying electric coupled in driving relationship to wheels of the locomotive, wherein the alternator produces direct current (DC) electric power and an electronic inverter converts the DC power to AC power for the electric motors, the inverter including a plurality of relatively high power semiconductor devices requiring external cooling, the method comprising the steps of:

mounting each of the semiconductor devices between respective pairs of hollow, air cooled heat sinks;

clamping each of the pairs of heat sinks into thermal contact with corresponding ones of the semiconductor devices;

connecting a first end of a first heat sink in each pair of heat sinks to an air supply plenum;

connecting a first end of a second heat sink in each pair of heat sinks to an air exhaust plenum;

coupling an insulative air conduit between second ends of each heat sink in each pair of heat sinks to form a continuous cooling air passage through each pair of heat sinks;

coupling an air blower to the air supply plenum for concurrently flowing air through each pair of heat sinks in parallel; and isolating the semiconductor devices from the air supply plenum whereby air does not flow directly onto the devices.

4. A direct current to alternating current, power converter system for a traction vehicle comprising:

a source of direct current (DC) electric power;

an inverter including a plurality of relatively high power semiconductor devices coupled in circuit with said DC source converting the DC electric power to alternating current (AC) electric power;

blower means for providing a flow of cooling air;

an electrical device compartment defined by at least one wall vertically oriented in said vehicle, an air exhaust and an air supply plenum being formed on an opposite side of said wall from said electrical device compartment, said wall including a plurality of apertures therethrough from each of said air exhaust and said air supply plenum;

a plurality of hollow air cooled heat sinks each having one end attached to said wall in a cantilever fashion, said heat sinks being arranged in pairs such that a first end of one of a pair is coupled to said wall overlaying an aperture therethrough to said air supply plenum and a first end of another of the pair is coupled to said wall overlaying an aperture therethrough to said air exhaust plenum;

means for directing cooling air from said blower means into said heat sinks;

conduit means coupling at least two of said heat sinks into a serial air flow path for sequentially flowing air through said at least two heat sinks;

exhaust means coupled to a downstream one of said at least two heat sinks for exhausting said cooling air away from said semiconductor devices; and said selected ones of said semiconductor devices comprising press-packs held under predetermined compression between opposing faces of said at least two heat sinks.

* * * * *